Oct. 12, 1965 R. E. NELSON 3,211,920
D.C. AMPLIFIER INCLUDING A FEEDBACK OSCILLATOR AND SATURABLE CORE
Filed Sept. 27, 1961
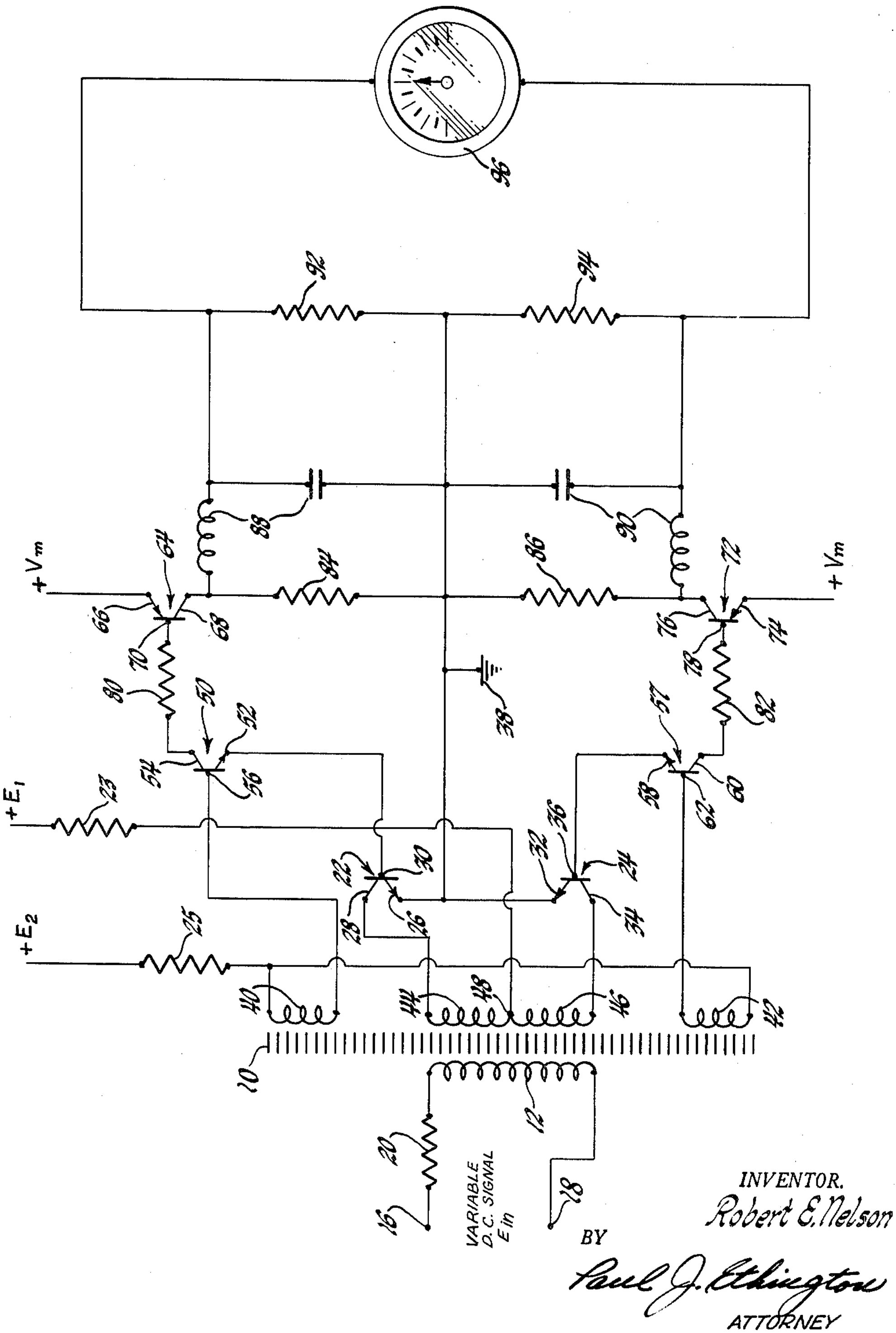
INVENTOR.
Robert E. Nelson
BY
Paul J. Ethington
ATTORNEY 3,211,920
Patented Oct. 12, 1965

3,211,920

D.C. AMPLIFIER INCLUDING A FEEDBACK OSCILLATOR AND SATURABLE CORE

Robert E. Nelson, Indianapolis, Ind., assignor to General Motors Corporation, Detroit, Mich., a corporation of Delaware Filed Sept. 27, 1961, Ser. No. 141,158
3 Claims. (Cl. 307—88.5)

This invention relates to D.C. amplifiers and more particularly to an improvement thereof wherein the output is a function of pulse durations from an oscillator controlled by the input.

It is frequently desirable to amplify low level D.C. signals of variable magnitude and polarity to render the signals usable. The usual problems encountered in D.C. amplifiers for low level signals are that such amplifiers are inherently unstable and are of low efficiency.

In accordance with the present invention, a D.C. amplifier of high stability and efficiency is provided comprising a magnetically coupled oscillator and a differentially connected output. The magnitude and polarity of a low level D.C. input signal control the pulse durations of the oscillator's output signals which are then filtered and differentially combined across the output. The voltage across the output is indicative of the polarity and proportional to the magnitude of the input signal.

A more complete understanding of the invention may be had from the detailed description which follows taken with the accompanying drawing in which:

The single figure is a schematic diagram of a circuit embodying the invention.

Referring to this figure there is shown an illustrative embodiment of the invention. A magnetically coupled oscillator stage includes a saturable core transformer 10 having wound thereon an input winding 12. A variable D.C. input signal $E_{in}$ is applied to the winding 12 at terminals 16 and 18 forming a series loop with a current limiting resistor 20. A regenerative feedback oscillator is provided comprising electronic control devices or transistors 22 and 24 connected in push-pull and being magnetically coupled to the transformer 10. The transistor 22 includes an emitter 26, a collector 28 and a base 30. The transistor 24 includes an emitter 32, a collector 34 and a base 36. The emitters 26 and 32 are connected together in common to ground 38. The transformer 10 has wound thereon two feedback windings 40 and 42 and two primary windings 44 and 46, which are connected together at a center tap 48. A bias source $E_1$ provides emitter to collector bias for the transistors 22 and 24 via a current limiting resistor 23, the center tap 48 and the primary windings 44 and 46 connected to the collectors 28 and 34, respectively.

A voltage amplification or multiplication stage is electrically coupled to the oscillator stage and includes transistors 50 and 57. The transistor 50 includes an emitter 52, a collector 54 and a base 56. The transistor 57 includes an emitter 58, a collector 60 and a base 62. A second bias source $E_2$ provides emitter to base bias for the transistors 22 and 24 via the base current limiting resistor 25 and the feedback windings 40 and 42 electrically coupled to the bases 30 and 36, respectively, through the base 56 to emitter 52 junction of transistor 50 and the base 62 to emitter 58 junction of the transistor 57, respectively. A transistor 64 is provided having an emitter 66, a collector 68 and a base 70. A transistor 72 is provided having an emitter 74, a collector 76 and a base 78. The transistor 64 is electrically coupled to the transistor 50 via the collector 54, a base current limiting resistor 80 and the base 70. The transistor 72 is electrically coupled to the transistor 57 via the collector 60, a base current limiting resistor 82 and the base 78.

Load resistors 84 and 86 are respectively connected between the collectors 68 and 76 and ground 38. A multiplying voltage $V_m$ is electrically connected between ground 38 and the emitters 66 and 74.

A filter stage is coupled to the voltage multiplication stage and includes LC filter circuits 88 and 90 electrically connected across the resistors 84 and 86, respectively. An output stage is coupled to the filter stage and includes output resistors 92 and 94 differentially connected across the filter circuits 88 and 90, respectively. A utilization means 96 is connected across the resistors 92 and 94.

Having thus described the connections of the circuit shown in the single figure the operation will now be described. If transistor 22 is assumed to be initially forward biased and transistor 24 is reverse biased the transistor 22 will conduct as determined by regenerative feedback voltage induced in the feedback winding 40 until the transformer core 10 becomes saturated at which time the regenerative feedback voltage will be reduced to zero. Accordingly, the conduction of transistor 22 abruptly decreases and the magnetic field of the transformer collapses, causing the voltage induced in the feedback winding 40 to reverse polarity and become degenerative. Thus, the base 56 of transistor 50 becomes negative with respect to the emitter 52 and terminates the conduction of the transistor 50. Consequently, the base to emitter current of transistor 22 is reduced to zero, rendering transistor 22 non-conductive. Simultaneously, the collapse of the transformer field causes a regenerative voltage to be induced in the feedback winding 42, rendering the base 62 of the transistor 57 positive with respect to the emitter 58 and thereby causing transistor 57 to become conductive. This permits forward bias current to flow from the voltage multiplying source $V_m$ from emitter 74 to base 78 of transistor 72, through resistor 82 and thence from collector 60 to emitter 58 of transistor 57 and from base 36 to emitter 32 of transistor 24 to thus forward bias the transistor 24. The transistor 24 will continue to conduct as determined by the regenerative feedback voltage induced in the feedback winding 42 until such time as the saturable core transformer 10 becomes saturated.

During the period in which transistor 24 is conductive, the transistor 72 is also forward biased and is conductive for a period as determined by the pulse duration of the regenerative feedback voltage induced in the feedback winding 42. When the transistor 72 is conductive the voltage multiplying source $V_m$ will be switched across the load resistor 86. The filter circuit 90 time averages the pulses appearing across the resistor 86 such that a D.C. voltage appears across the output resistor 94 having a magnitude as determined by the duration of the voltage induced in the feedback winding 42. In a like manner, a D.C. voltage will appear across the output resistor 92 but of opposite polarity from that across the output resistor 94 and will have a magnitude dependent upon the duration of the regenerative feedback voltage induced in the feedback winding 40. The utilization means 96 is responsive to the difference in the currents flowing through the resistors 92 and 94. If no input signal is applied to the input winding 12 the pulse durations of the regenerative feedback voltages induced in the feedback windings 40 and 42 will be equal and thus the time average D.C. signals appearing across the output resistors 92 and 94 will be equal in magnitude and opposite in polarity and hence no output will be indicated by the utilization means 96.

When a variable D.C. input signal $E_{in}$ is applied across the terminals 16 and 18 of the input winding 12, an output will be obtained from the differentially combined output resistors 92 and 94 of a magnitude and polarity proportional to the input signal $E_{in}$. For example, if it is assumed that when a variable D.C. voltage $E_{in}$ is applied across the terminals 16 and 18 a current flows in a counterclockwise direction through the input winding 12, then the current therein will be in such a direction to decrease the time to saturate the transformer core 10 when the transistor 22 is conductive and to increase the time to saturate the transformer core 10 when the transistor 24 is conductive. The regenerative feedback voltage induced in the feedback winding 40 will have a duration less than that induced in the feedback winding 42 and the transistor 50 will conduct for a period shorter than will transistor 57. Inasmuch as the conductivity of transistors 64 and 72 is controlled by the transistors 50 and 57, respectively, it is seen that the multiplying voltage $V_m$ will appear across the load resistor 84 for a period less than that across the load resistor 86 and thus the D.C. time average voltage appearing across the output resistor 92 will be opposite in polarity and of a smaller magnitude than that appearing across the output resistor 94. It is therefore seen that since the utilization means 96 is responsive to the differential outputs taken across the output resistors 92 and 94 it will be indicative of the polarity and proportional to the magnitude of the input signal $E_{in}$. Likewise, if the input signal $E_{in}$ is of such a polarity that the current flowing through the input winding 12 is in a clockwise direction the time average D.C. signal appearing across the output resistor 92 will be of a greater magnitude than that appearing across the output resistor 94 and the utilization means 96 will be responsive thereto.

Although the description of this invention has been given with respect to a particular embodiment it is not to be construed in a limiting sense. Numerous variations and modifications within the spirit and scope of the invention will now occur to those skilled in the art. For a definition of the invention reference is made to the appended claims.

What is claimed is:

1. A D.C. amplifier comprising an oscillator including a saturable core having a pair of primary windings and a pair of feedback windings, a first pair of transistors each having an input circuit and an output circuit, a voltage source, the output circuit of each transistor being connected across the voltage source via one of the primary windings, a second pair of transistors, each feedback winding being connected across the input circuit of one of the first pair of transistors via a transistor of the second pair of transistors for alternately biasing one of the transistors of the first pair of transistors conductive and the other transistor of the first pair of transistors non-conductive to generate output pulses in the windings at a frequency determined by the frequency of saturation of the core, a third pair of transistors, each of the transistors of the second pair of transistors being directly coupled with a transistor of the third pair of transistors, a voltage multiplying source, a pair of load resistors alternately connected across the voltage multiplying source via a different one of the transistors of the third pair of transistors, a filter connected across each load resistor for developing an output voltage corresponding to the time average value of the output pulses, a pair of output resistors connected together in series with each output resistor connected across one of the filters so that the output voltages of the filters are combined differentially, utilization means connected across the output resistors and responsive to the differential output voltage, a D.C. signal voltage source and an input winding on the saturable core connected therewith to magnetically bias the core to vary the saturation of the core and to increase the conduction period of one of said first pair of transistors and decrease the conduction period of the other of said first pair of transistors in accordance with the polarity and magnitude of the signal voltage.

2. A D.C. amplifier comprising a saturable magnetic core having first and second primary windings and a control winding, a D.C. input signal applied to said control winding, first and second current control means operatively connected with said first and second primary windings to obtain current flow alternately through said first and second current control means for a time duration dependent upon the magnitude of said D.C. input signal, a source of voltage, first and second load means, first and second filter means, first and second electronic switching means operatively connected to said first and second current control means respectively and operatively coupling said source across said first load means and said first filter means and said second load means and said second filter means respectively, said source being connected across said first and second load means for a time duration dependent upon the duration of current flow in said first and second current control means respectively, utilization means connected across said first and second load means and responsive to the differential voltage appearing at the output of said first and second filter means.

3. A D.C. amplifier comprising a saturable magnetic core having a pair of primary windings and a pair of feedback windings, first and second switching transistors having emitter, base and collector electrodes, means connecting the emitter and collector electrodes of the first and second switching transistors across said first and second primary windings respectively, first and second amplifying transistors having emitter, base and collector electrodes, means connecting said first and second feedback windings with the base electrodes of the first and second switching transistors through the base and emitter electrodes of said first and second amplifying transistors respectively, third and fourth switching transistors having emitter, base and collector electrodes, a voltage multiplication source, means connecting the collector electrode of said first and second amplifying transistors with the base electrode of said third and fourth switching transistors respectively, first and second load resistors connected across said voltage multiplication source through the emitter and collector electrodes of said second and third switching transistors, first and second filter networks connected across said first and second load resistors, respectively, a D.C. input signal connected with a control winding on said saturable core for varying the period of conduction of said first and second switching transistors in accordance with the magnitude and polarity of said input signal, utilization means responsive to the differential voltage appearing at the output of said first and second filter networks.

References Cited by the Examiner

UNITED STATES PATENTS

| | | | |
|---|---|---|---|
| 2,883,539 | 4/59 | Bruck et al. | 331—114 |
| 3,013,220 | 12/61 | Norris | 331—113 |
| 3,054,066 | 9/62 | Crane | 330—24 X |

OTHER REFERENCES

Sherin: Transfluxor Oscillator, March 4, 1960, Electronics, pages 48–49.

Roehr: Application notes, An Efficient High Power D.C. to D.C. Converter, AN 105, July 1960, Motorola Semiconductor Products Inc.

ROY LAKE, *Primary Examiner.*

ARTHUR GAUSS, NATHAN KAUFMAN, *Examiners.*

UNITED STATES PATENT OFFICE

CERTIFICATE OF CORRECTION

Patent No. 3,211,920 October 12, 1965

Robert E. Nelson

It is hereby certified that error appears in the above numbered patent requiring correction and that the said Letters Patent should read as corrected below.

Column 4, lines 44 and 45, for "second and third" read -- third and fourth --; line 65, for "July" read -- June --.

Signed and sealed this 7th day of June 1966.

(SEAL)
Attest:

ERNEST W. SWIDER
Attesting Officer

EDWARD J. BRENNER
Commissioner of Patents